US009385044B2

(12) United States Patent
Lii

(10) Patent No.: US 9,385,044 B2
(45) Date of Patent: Jul. 5, 2016

(54) REPLACEMENT GATE PROCESS

(71) Applicant: Texas Instruments Incorporated, Dallas, TX (US)

(72) Inventor: Tom Lii, Plano, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 145 days.

(21) Appl. No.: 14/142,144

(22) Filed: Dec. 27, 2013

(65) Prior Publication Data

US 2014/0187010 A1 Jul. 3, 2014

Related U.S. Application Data

(60) Provisional application No. 61/747,700, filed on Dec. 31, 2012.

(51) Int. Cl.
| | |
|---|---|
| H01L 21/336 | (2006.01) |
| H01L 21/28 | (2006.01) |
| H01L 21/321 | (2006.01) |
| H01L 21/3213 | (2006.01) |
| H01L 21/8234 | (2006.01) |
| H01L 29/423 | (2006.01) |

(Continued)

(52) U.S. Cl.
CPC .. *H01L 21/823437* (2013.01); *H01L 21/28114* (2013.01); *H01L 29/42376* (2013.01); *H01L 29/4966* (2013.01); *H01L 29/518* (2013.01); *H01L 29/66545* (2013.01); *H01L 29/78* (2013.01); *H01L 21/31053* (2013.01); *H01L 21/31116* (2013.01)

(58) Field of Classification Search
CPC ............. H01L 29/66545; H01L 29/66553; H01L 29/6656; H01L 21/823437

USPC ................... 438/926, 595, 692; 257/E21.444
See application file for complete search history.

(56) References Cited

U.S. PATENT DOCUMENTS 5,618,113 A * 4/1997 Derby ........................... 383/121
5,712,185 A * 1/1998 Tsai et al. ..................... 438/424

(Continued)

FOREIGN PATENT DOCUMENTS

FR        2 979 166 A1 *  2/2013  .......... H01L 21/8232

OTHER PUBLICATIONS

Hee Kwan Lee et al., Selective Etching of Thick Si3N4, SiO2 and Si by Using CF4/O2 and C2F6 Gases with or without O2 or Ar Addition, Journal of the Korean Physical Society, vol. 54, No. 5, May 2009, pp. 1816-1823.*

*Primary Examiner* — Mary Wilczewski
(74) *Attorney, Agent, or Firm* — Jacqueline J. Garner; Frank D. Cimino

(57) ABSTRACT

An integrated circuit containing metal replacement gates may be formed by forming a CMP stop layer over sacrificial gates, and forming a dielectric fill layer over the CMP stop layer. Dielectric material from the dielectric fill layer is removed from over the sacrificial gates using a CMP process which exposes the CMP stop layer over the sacrificial gates but does not expose the sacrificial gates. The CMP stop layer is removed from over the sacrificial gates using a plasma etch process. In one version, the plasma etch process may be selective to the CMP stop layer. In another version, the plasma etch process may be a non-selective etch process. After the sacrificial gates are exposed by the plasma etch process, the sacrificial gates are removed and the metal replacement gates are formed.

11 Claims, 15 Drawing Sheets

(51) Int. Cl.
  *H01L 29/49* (2006.01)
  *H01L 29/51* (2006.01)
  *H01L 29/66* (2006.01)
  *H01L 29/78* (2006.01)
  *H01L 21/3105* (2006.01)
  *H01L 21/311* (2006.01)

(56) References Cited

U.S. PATENT DOCUMENTS

| | | | |
|---|---|---|---|
| 5,960,270 A * | 9/1999 | Misra et al. | 438/197 |
| 6,051,480 A * | 4/2000 | Moore et al. | 438/435 |
| 6,214,697 B1 * | 4/2001 | Moore et al. | 438/424 |
| 6,271,094 B1 * | 8/2001 | Boyd et al. | 438/287 |
| 6,440,808 B1 * | 8/2002 | Boyd et al. | 438/305 |
| 6,465,334 B1 * | 10/2002 | Buynoski et al. | 438/591 |
| 6,559,051 B1 * | 5/2003 | Buynoski et al. | 438/678 |
| 6,573,189 B1 * | 6/2003 | Lin et al. | 438/725 |
| 6,583,012 B1 * | 6/2003 | Buynoski et al. | 438/275 |
| 6,939,751 B2 * | 9/2005 | Zhu et al. | 438/151 |
| 8,084,311 B1 * | 12/2011 | Horak et al. | 438/183 |
| 8,399,315 B2 * | 3/2013 | Yin et al. | 438/151 |
| 8,741,723 B2 * | 6/2014 | Chi | 438/299 |
| 2001/0016392 A1 * | 8/2001 | Ponomarev et al. | 438/291 |
| 2005/0090066 A1 * | 4/2005 | Zhu et al. | 438/300 |
| 2007/0066077 A1 * | 3/2007 | Akasaka et al. | 438/710 |
| 2010/0112798 A1 * | 5/2010 | Lai et al. | 438/591 |
| 2011/0086502 A1 * | 4/2011 | Yeh et al. | 438/585 |
| 2011/0195575 A1 * | 8/2011 | Wang | 438/692 |
| 2012/0032238 A1 * | 2/2012 | Teo et al. | 257/288 |
| 2012/0088359 A1 * | 4/2012 | Kim et al. | 438/589 |
| 2012/0211844 A1 * | 8/2012 | Schloesser et al. | 257/410 |
| 2013/0105916 A1 * | 5/2013 | Chang et al. | 257/410 |
| 2013/0288468 A1 * | 10/2013 | Chi | 438/525 |
| 2013/0288471 A1 * | 10/2013 | Chi | 438/586 |
| 2014/0015104 A1 * | 1/2014 | Su et al. | 257/611 |
| 2014/0187010 A1 * | 7/2014 | Lii | 438/299 |
| 2014/0199836 A1 * | 7/2014 | Chen et al. | 438/675 |
| 2014/0287565 A1 * | 9/2014 | Yin et al. | 438/308 |

* cited by examiner

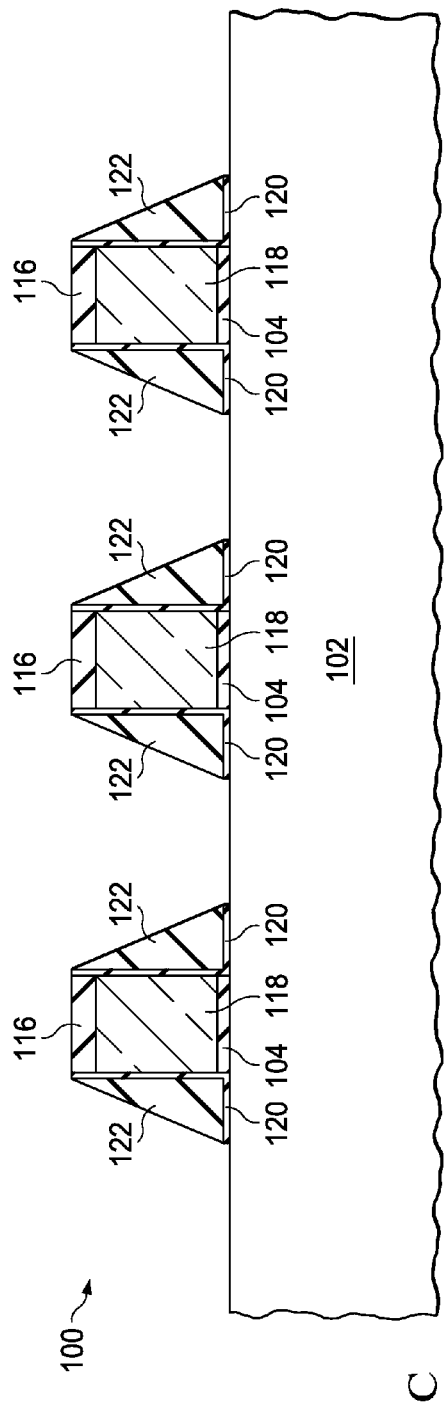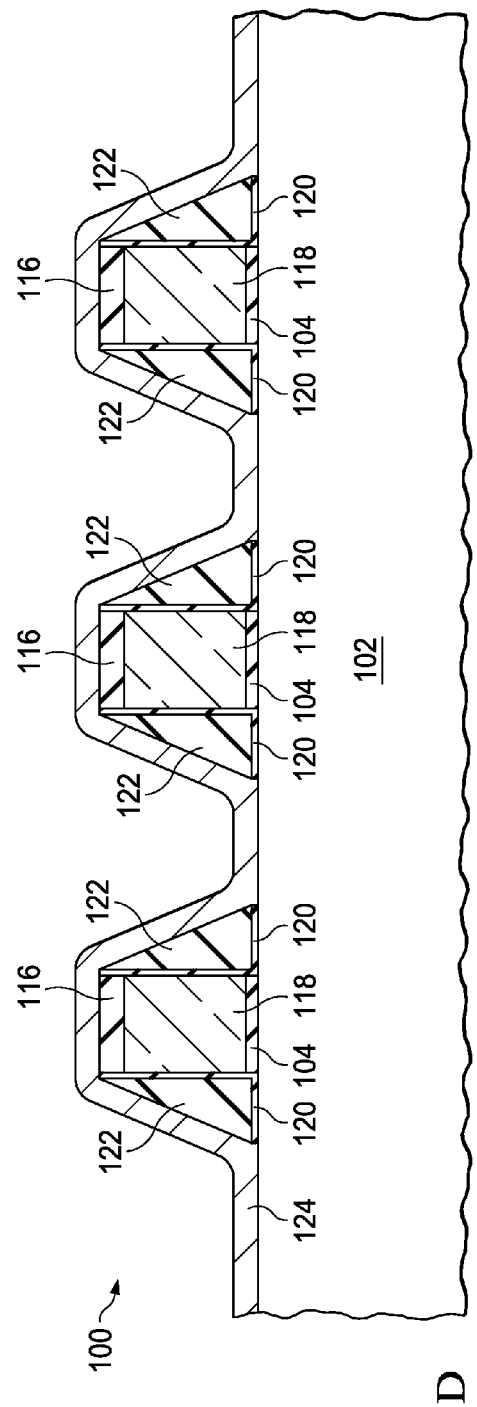
FIG. 1C
FIG. 1D

REPLACEMENT GATE PROCESS

CROSS-REFERENCE TO RELATED APPLICATIONS

This application claims the benefit of priority under U.S.C. §119(e) of U.S. Provisional Application 61/747,700 filed Dec. 31, 2012, which is hereby incorporated by reference in its entirety.

FIELD OF THE INVENTION

This invention relates to the field of integrated circuits. More particularly, this invention relates to metal replacement gate transistors in integrated circuits.

BACKGROUND OF THE INVENTION

Some integrated circuits contain metal replacement gate transistors, formed by removing sacrificial gates. Sacrificial gates which are removed after forming a dielectric fill layer require the dielectric material to be removed over the sacrificial gates. Removing the dielectric material to expose the sacrificial gates with chemical mechanical polish (CMP) processes risks non-uniform polishing across the integrated circuit and resultant non-uniformity in heights of the replacement metal gates, and/or bridging metal between adjacent gates. Removing the dielectric material with etch processes risks non-uniform exposure of the sacrificial gates and undesirable topography in the dielectric material.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit containing metal replacement gates may be formed by forming a CMP stop layer over sacrificial gates, and forming a dielectric fill layer over the CMP stop layer. Dielectric material from the dielectric fill layer is removed from over the sacrificial gates using a CMP process which exposes the CMP stop layer over the sacrificial gates but does not expose the sacrificial gates. The CMP stop layer is removed from over the sacrificial gates using a plasma etch process. In one version, the plasma etch process may be a selective etch process which removes the CMP stop layer at least twice as quickly as the dielectric fill layer. In another version, the plasma etch process may be a non-selective etch process that has an etch rate of the CMP stop layer which is 75 percent to 150 percent of an etch rate of the dielectric fill layer. After the sacrificial gates are exposed by the plasma etch process, the sacrificial gates are removed and the metal replacement gates are formed.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit containing metal replacement gates may be formed by forming a CMP stop layer over sacrificial gates, and forming a dielectric fill layer over the CMP stop layer. The CMP stop layer may include silicon nitride and/or silicon oxynitride. The dielectric fill layer may include silicon dioxide, boron-phosphorus silicate glass (BPSG), and/or low-k dielectric material such as organo-silicate glass (OSG), carbon-doped silicon oxides (SiCO or CDO) or silicon oxide formed from methylsilsesquioxane (MSQ).

Dielectric material from the dielectric fill layer is removed from over the sacrificial gates using a CMP process which exposes the CMP stop layer over the sacrificial gates but does not expose the sacrificial gates. The CMP stop layer is removed from over the sacrificial gates using a plasma etch process. In one version, the plasma etch process may be a selective etch process which removes the CMP stop layer at least twice as quickly as the dielectric fill layer. An optional subsequent second CMP process may remove additional dielectric material from the dielectric fill layer. In another version, the plasma etch process may be a non-selective etch process that has an etch rate of the CMP stop layer which is 75 percent to 150 percent of an etch rate of the dielectric fill layer. After the sacrificial gates are exposed by the plasma etch process, the sacrificial gates are removed and the metal replacement gates are formed.

Figure 1A:
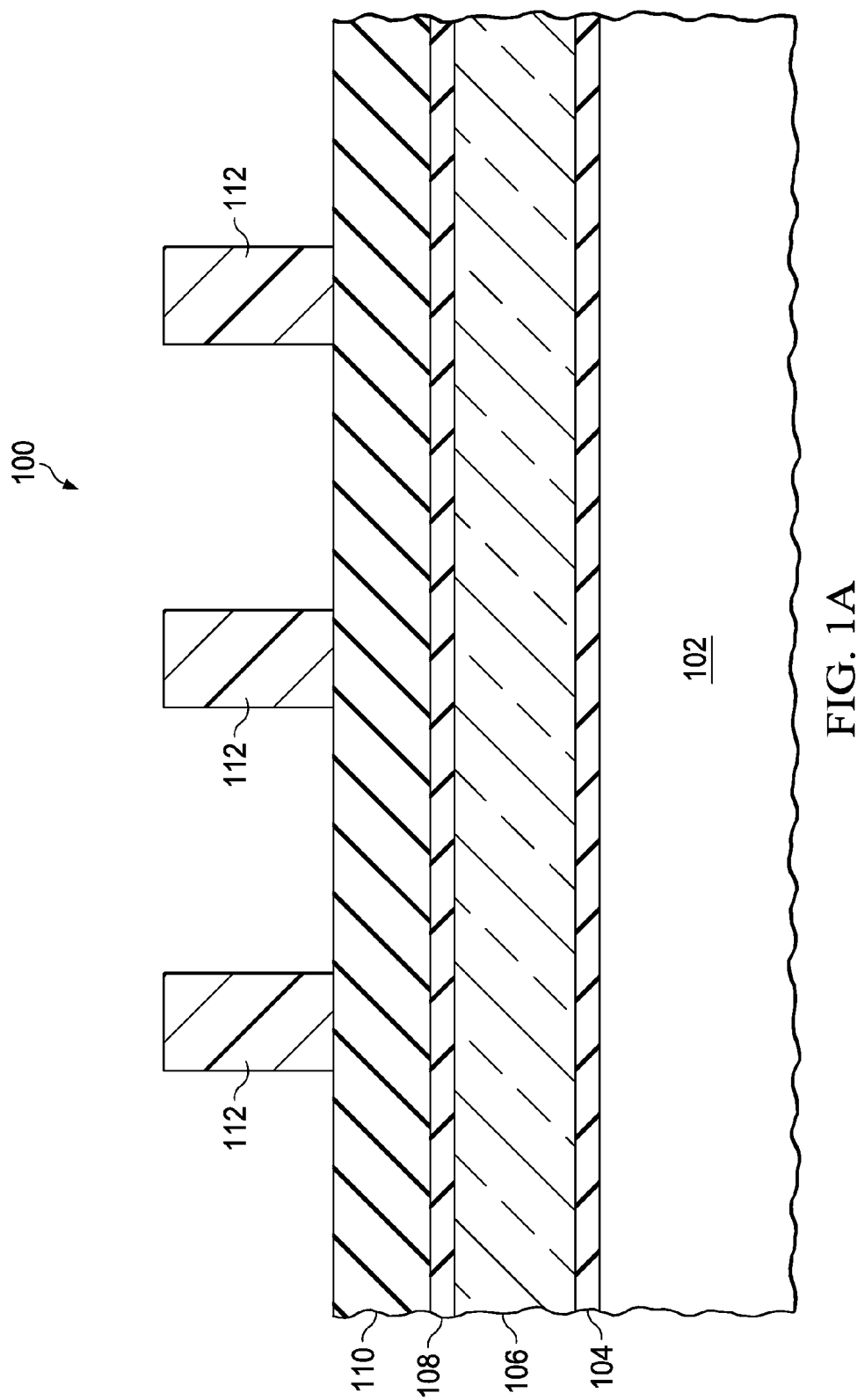
FIG. 1A through FIG. 1N are cross sections of an integrated circuit containing metal replacement gates formed according to an example method, depicted in successive stages of fabrication.
Figure 1B:
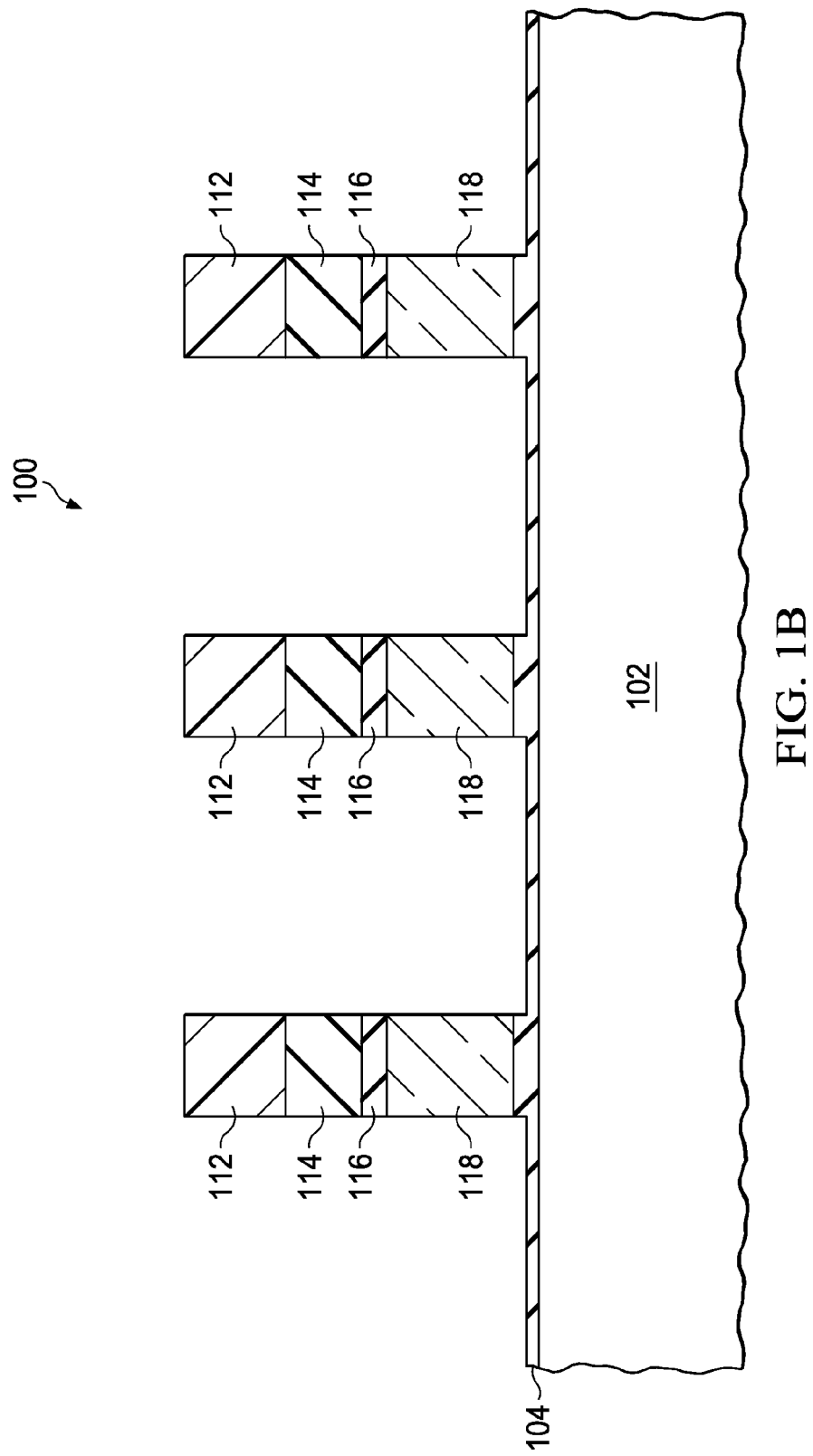
Figure 1E:
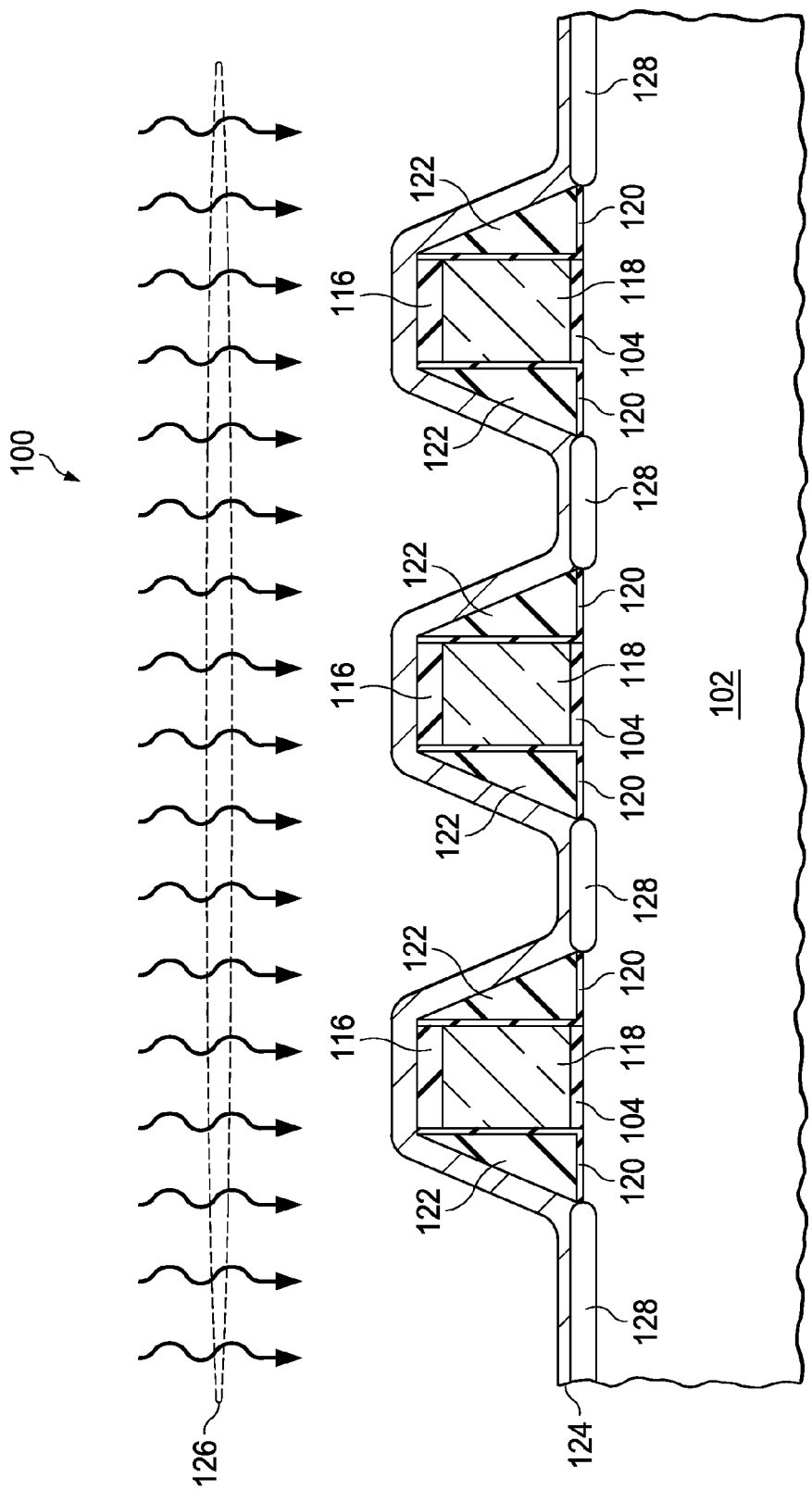
Figure 1F:
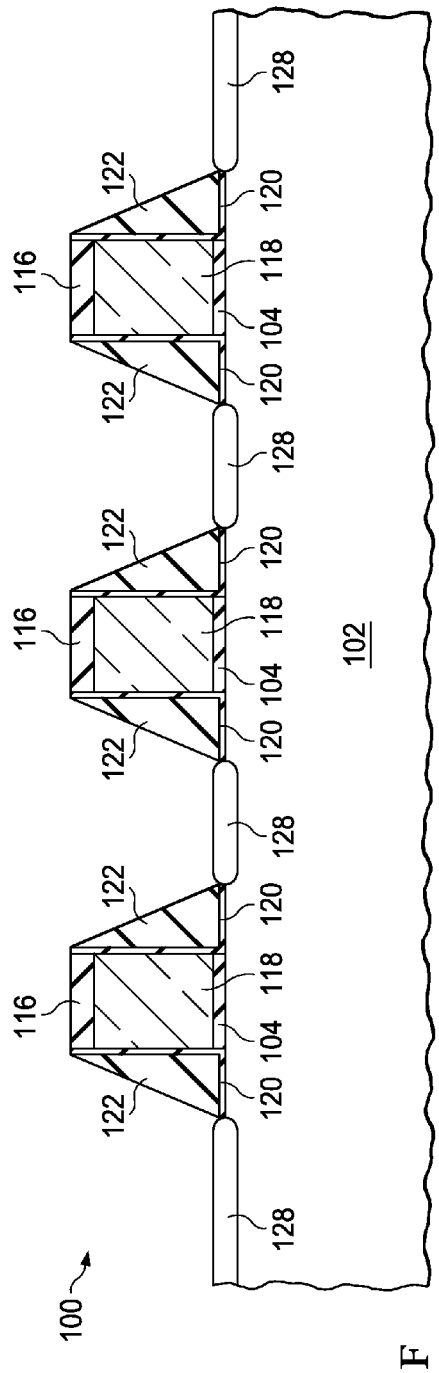
Figure 1K:
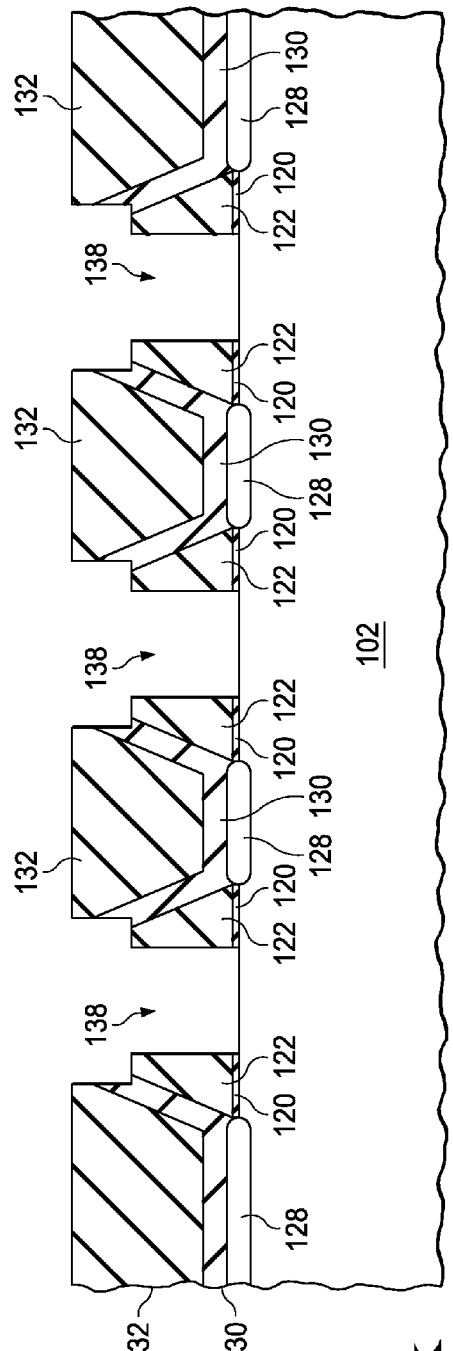
Figure 1G:
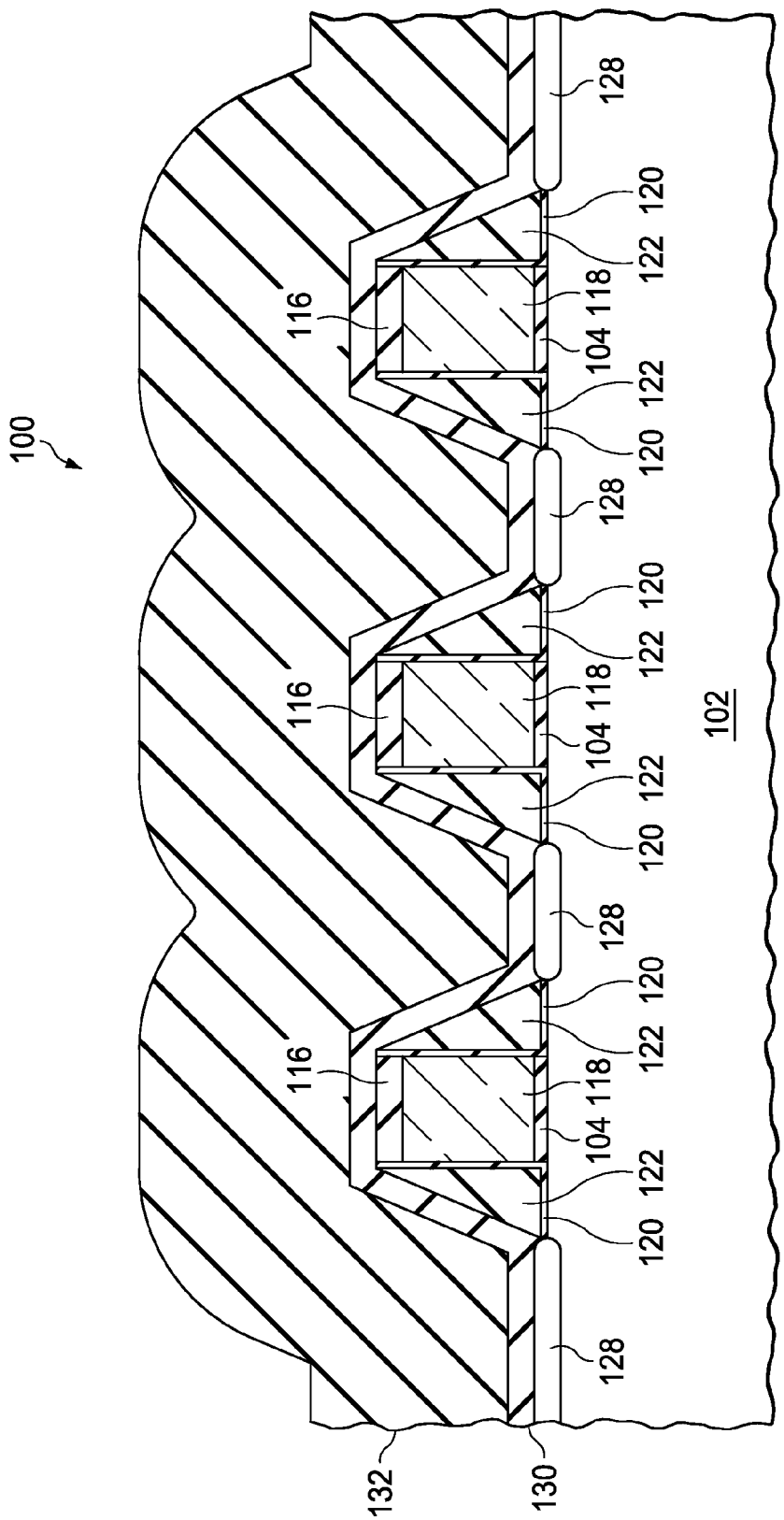
Figure 1H:
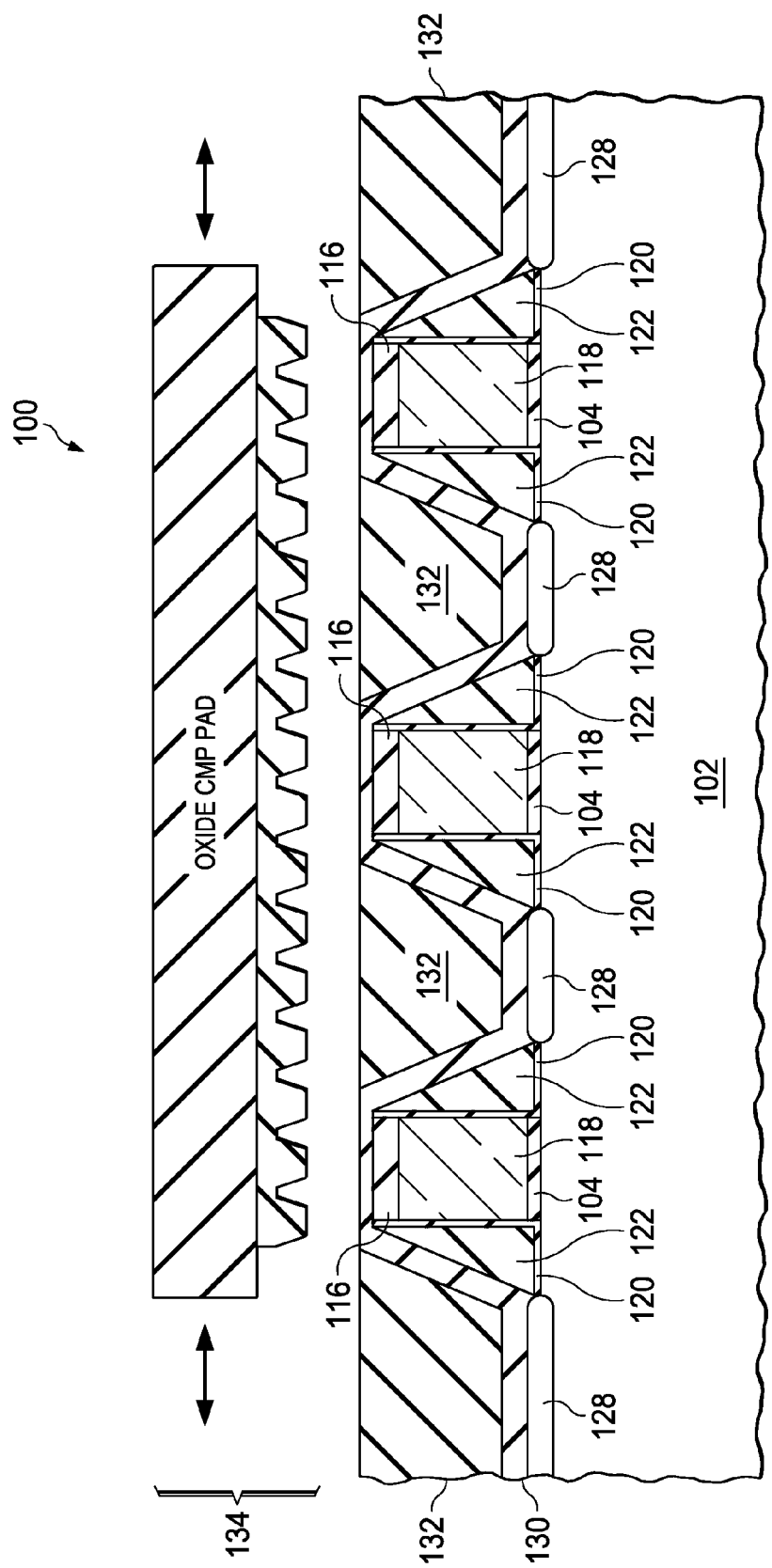
Figure 1I:
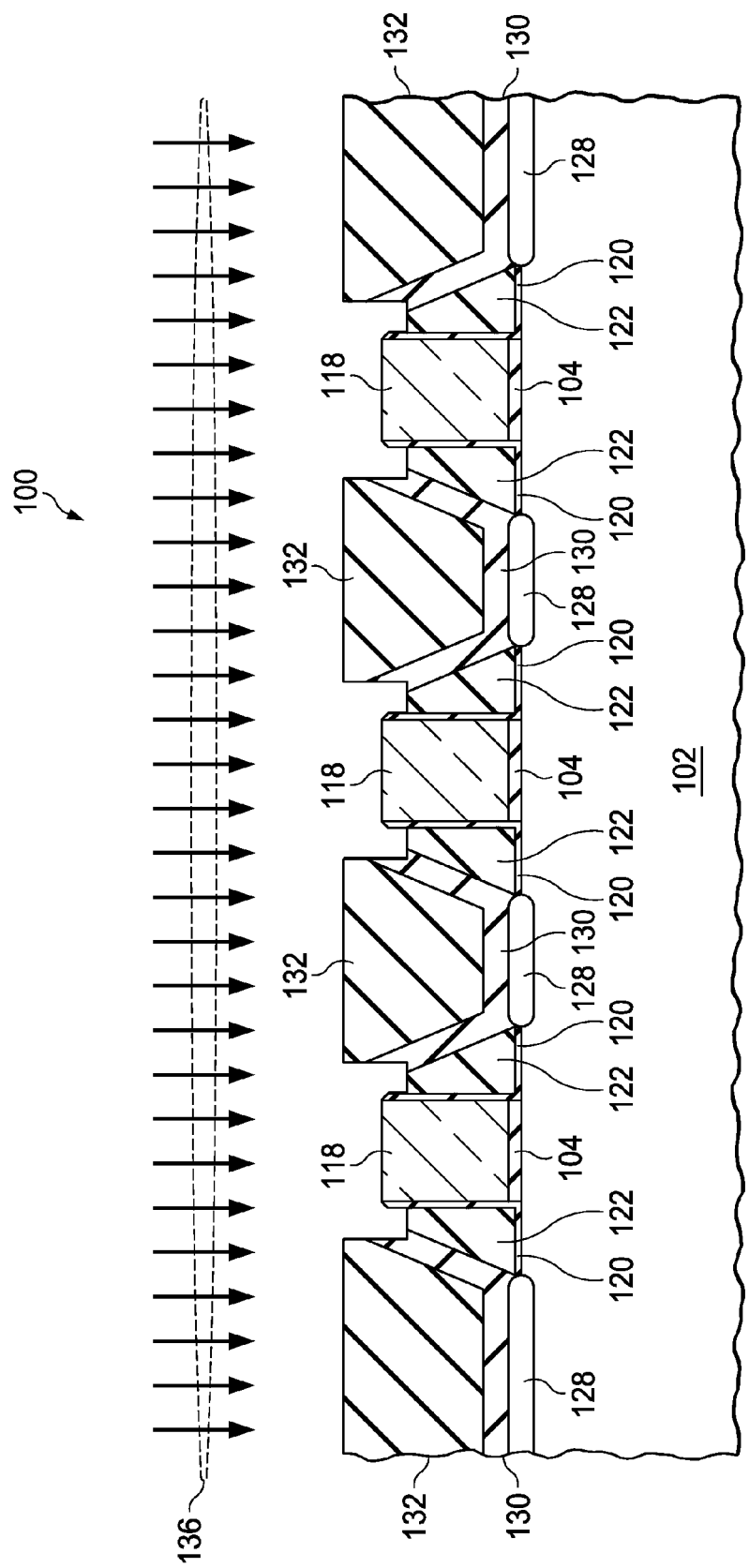
Figure 1J:
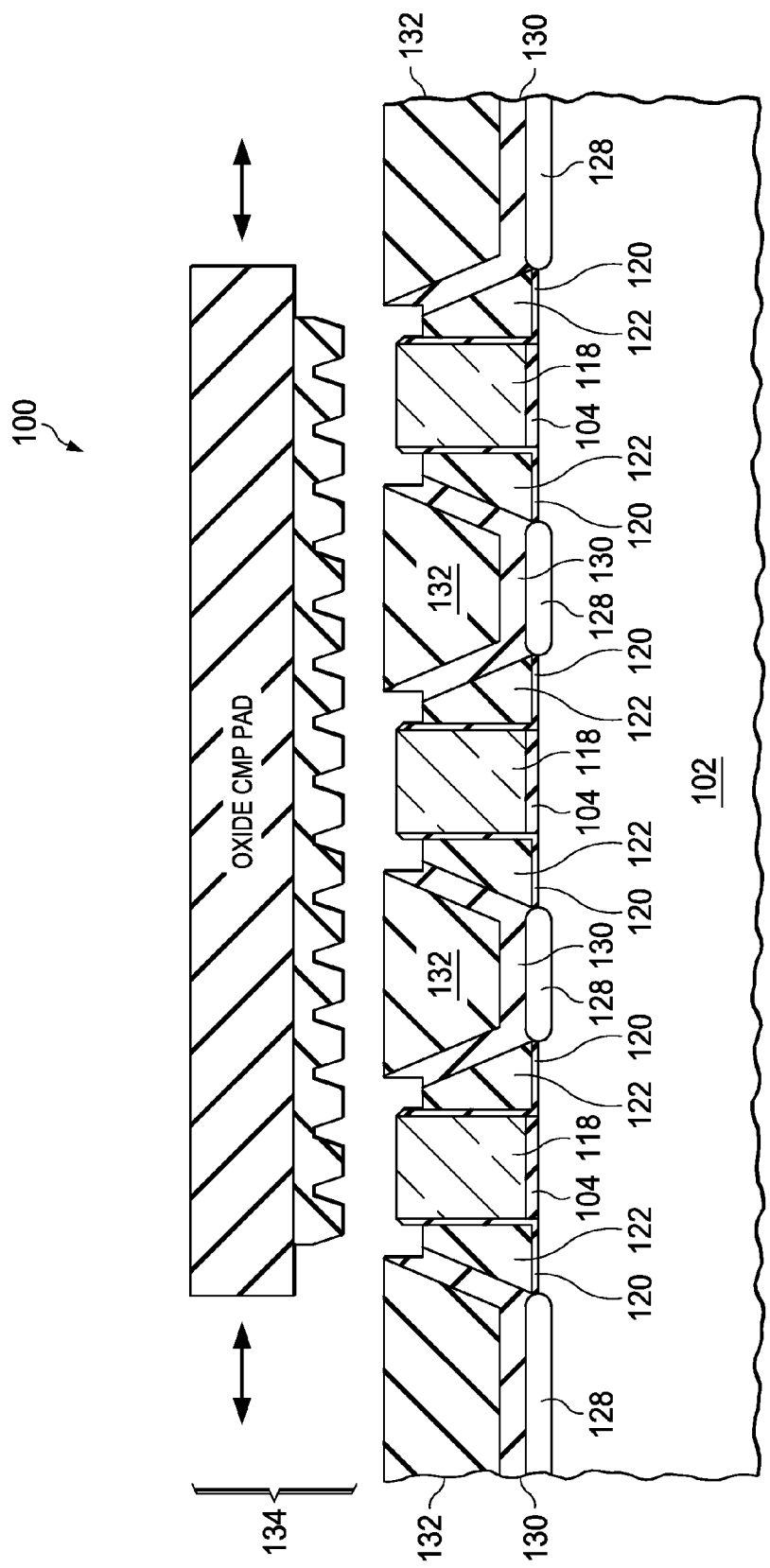
Figure 1L:
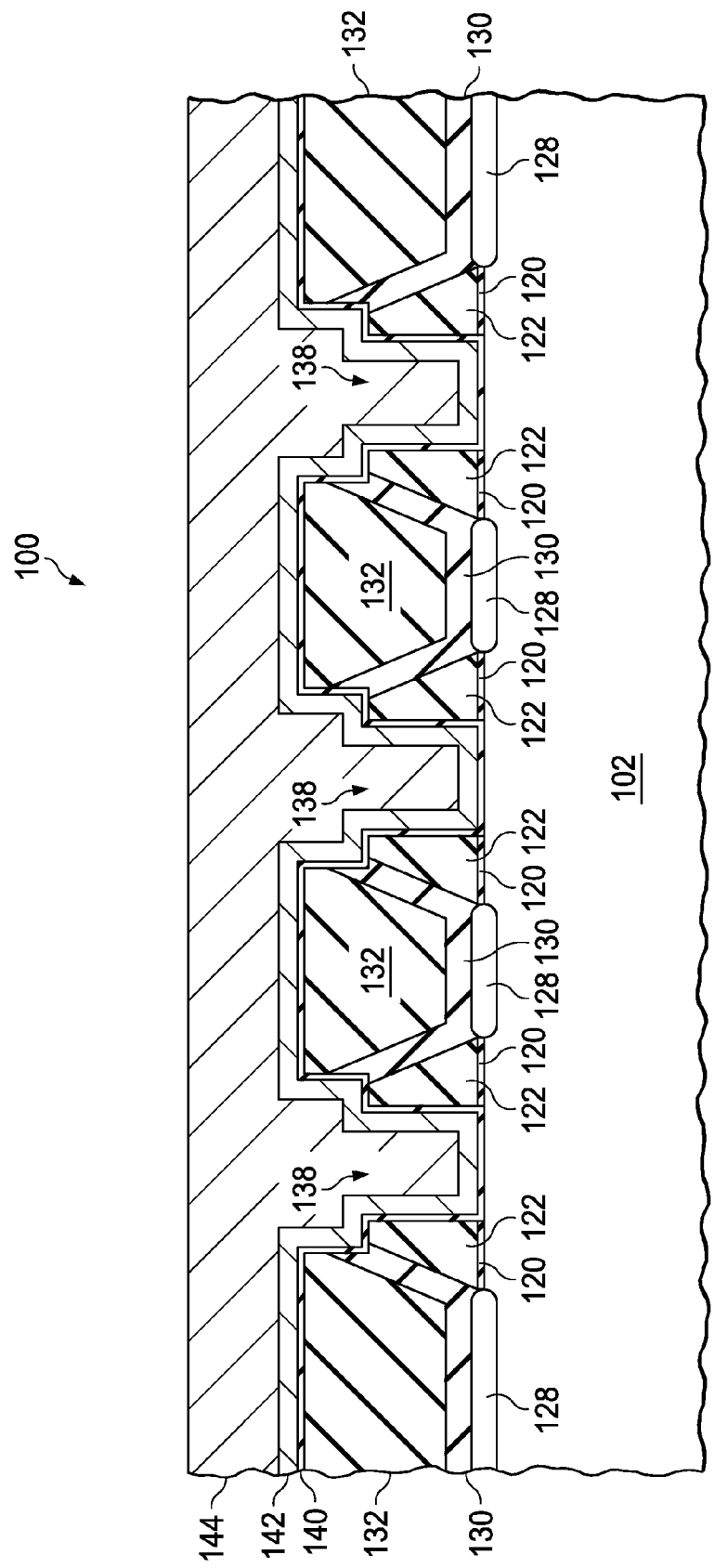
Figure 1M:
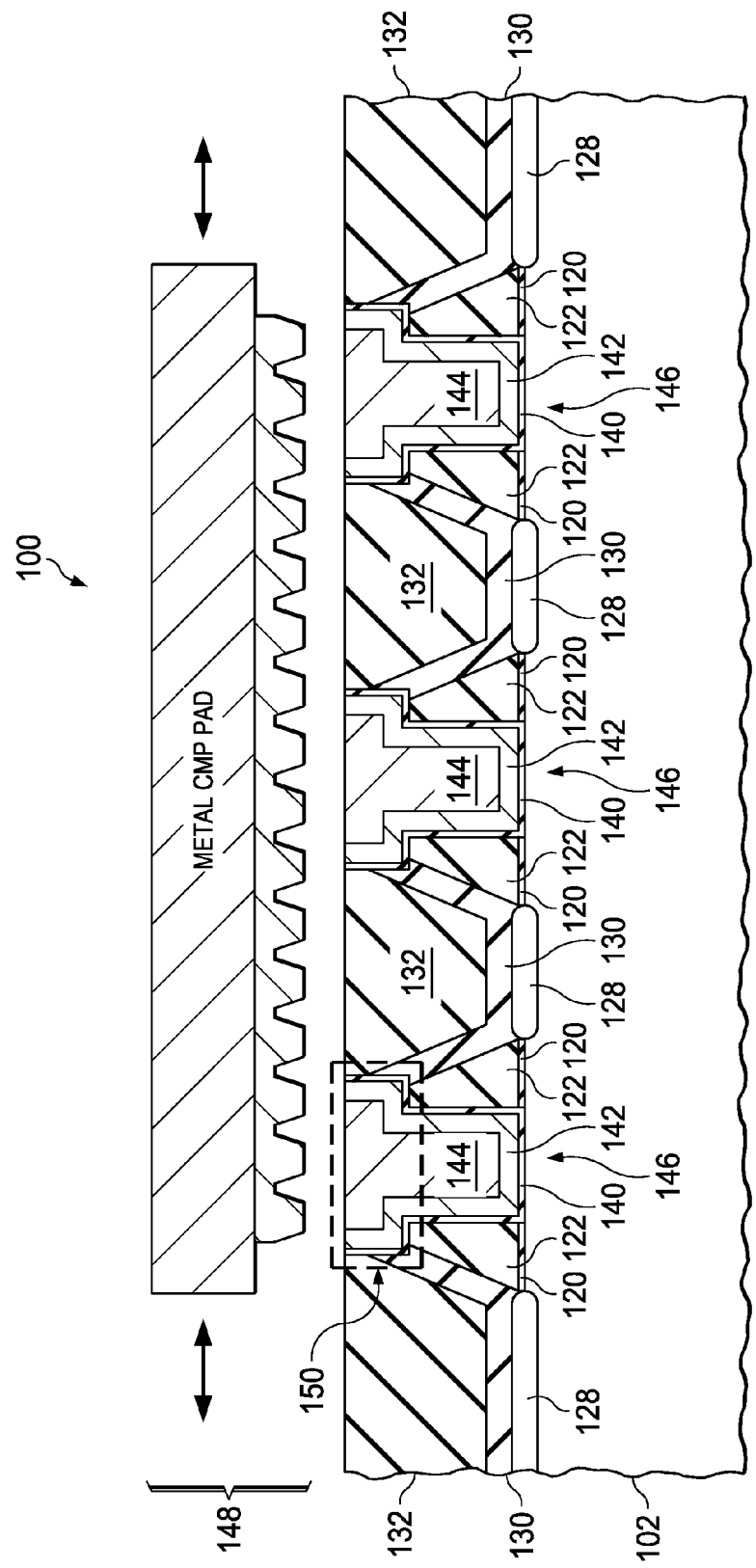
Figure 1N:
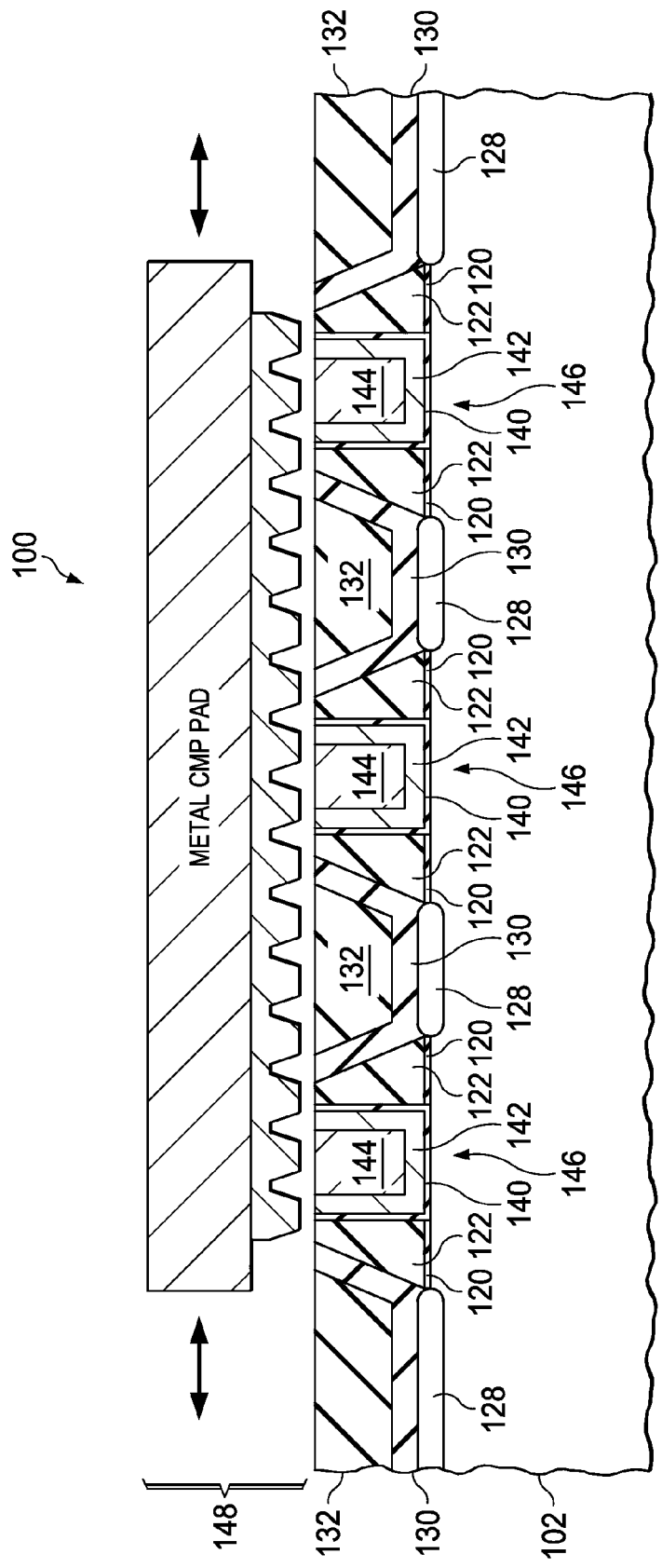

FIG. 1A through FIG. 1N are cross sections of an integrated circuit containing metal replacement gates formed according to an example method, depicted in successive stages of fabrication. Referring to FIG. 1A, the integrated circuit 100 is formed on a substrate 102 which includes semiconductor material such as silicon, silicon-germanium, gallium arsenide, gallium nitride, or aluminum gallium nitride.

A gate dielectric layer 104 is formed over the substrate 102. In one version of the instant example, which is depicted in FIG. 1A through FIG. 1N, the gate dielectric layer 104 is a sacrificial gate dielectric layer, and will be removed and replaced with a replacement gate dielectric layer. In such a version, the gate dielectric layer 104 may include silicon dioxide 2 nanometers to 10 nanometers thick, and may be formed by thermal oxidation of silicon in the substrate 102 if present, or may be formed by a plasma enhanced chemical vapor deposition (PECVD) process. In another version of the instant example, the gate dielectric layer 104 may be a permanent gate dielectric layer, may be 1 nanometer to 3 nanometers thick, and may include any combination of silicon dioxide, silicon oxy-nitride, and oxide, oxynitrides and/or silicates of aluminum, hafnium, zirconium tantalum, yttrium and/or lanthanum.

A layer of sacrificial gate material 106 is formed over the gate dielectric layer 104. The layer of sacrificial gate material 106 may be 50 nanometers to 200 nanometers thick, and may be include primarily polycrystalline silicon, referred to as polysilicon. An optional dielectric cap layer 108 may be formed over the layer of sacrificial gate material 106. The dielectric cap layer 108 may be 10 nanometers to 50 nanometers thick, and may include silicon nitride, and/or silicon oxynitride. The dielectric cap layer 108 may be formed by a PECVD process.

An optional layer of hard mask material 110 may be formed over the layer of sacrificial gate material 106, and over the optional dielectric cap layer 108 if present. The layer of hard mask material 110 may include amorphous carbon. A gate mask 112 is formed over the layer of sacrificial gate material 106, and over the optional layer of hard mask material 110 if present. The gate mask 112 covers areas for subsequently formed sacrificial gates. The gate mask 112 may include photoresist formed by a photolithographic process.

Referring to FIG. 1B, a first step of a gate etch process removes hard mask material from the layer of hard mask material 110 of FIG. 1A if present in areas exposed by the gate mask 112 to form a hard mask 114 over areas for the sacrificial gates. A second step of the gate etch process removes dielectric material from the dielectric cap layer 108 of FIG. 1A if present in areas exposed by the hard mask 114 to form gate caps 116 over areas for the sacrificial gates. A third step of the gate etch process removed material from the layer of sacrificial gate material 106 of FIG. 1A in areas exposed by the hard mask 114 and the gate caps 116 to form the sacrificial gates 118. The gate mask 112 may be eroded as depicted in FIG. 1B, or may be substantially removed, by the gate etch process. A portion, or substantially all, of the gate dielectric layer 104 between the sacrificial gates 118 may be removed by the gate etch process. After the gate etch process is completed, any remaining portion of the gate mask 112 and the hard mask 114 are removed, for example by ashing and wet clean processes.

Referring to FIG. 1C, offset spacers 120 are formed on lateral surfaces of the sacrificial gates 118, extending over the substrate 102 adjacent to the sacrificial gates 118. The offset spacers may be 1 nanometer to 10 nanometers thick, and may include one or more layers of silicon dioxide, silicon nitride and/or silicon oxynitride. The offset spacers 120 may be at least partially formed by oxidation of silicon in the sacrificial gates 118. The offset spacers 120 may incorporate remaining gate dielectric layer 104 adjacent to the sacrificial gates 118. The offset spacers 120 may be used to define lateral extents of source/drain extensions, not shown, with respect to the sacrificial gates 118. Sidewall spacers 122 are formed on the offset spacers 120. The sidewall spacers 122 may include one or more layers of silicon nitride, silicon dioxide and/or silicon oxynitride. The sidewall spacers 122 may be formed by forming one or more conformal layers of sidewall material over an existing top surface of the integrated circuit 100. An anisotropic etch removes the layers of sidewall material from over tops of, and between, the sacrificial gates 118 to leave the sidewall spacers 122. The sidewall spacers 122 may be used to define lateral extents of source/drain regions, not shown, with respect to the sacrificial gates 118.

Referring to FIG. 1D, a layer of metal 124 is formed over an existing top surface of the integrated circuit 100, contacting the substrate 102 between the sidewall spacers 122. The layer of metal 124 may include titanium, platinum, cobalt, nickel, molybdenum and/or chromium. The layer of metal 124 may be 10 nanometers to 50 nanometers thick, formed by a sputter process.

Referring to FIG. 1E, a rapid thermal process 126 heats the integrated circuit 100 causing the layer of metal 124 to react with the substrate 102 to form a layer of metal silicide 128 between the layer of metal 124 and the substrate 102 between the sidewall spacers 122. The optional gate caps 116 if present prevent metal silicide from forming on the sacrificial gates 118. Other methods of preventing metal silicide from forming on the sacrificial gates 118 are within the scope of the instant example.

Referring to FIG. 1F, unreacted metal of the layer of metal 124 of FIG. 1E is removed, leaving the layer of metal silicide 128 at a top surface of the substrate 102 between the sidewall spacers 122. The unreacted metal of the layer of metal 124 may be removed by a wet etch including an aqueous mixture of sulfuric acid and hydrogen peroxide.

Referring to FIG. 1G, a CMP stop layer 130 is formed over the sacrificial gates 118, the sidewall spacers 122, the gate cap 116 if present and the substrate 102. The CMP stop layer 130 may include one or more layers of silicon nitride and/or silicon oxynitride, and may be 5 nanometers to 50 nanometers thick. The CMP stop layer 130 may be formed by a PECVD process. The CMP stop layer 130 may provide a contact etch stop layer (CESL) for subsequent formation of contacts. The CMP stop layer 130 may also have compressive or tensile stress above 100 megapascals (MPa) to provide a stress layer which applies stress to the substrate 102 under subsequently formed replacement metal gates to increase an on-state current in transistors containing the replacement metal gates.

A dielectric fill layer 132 is formed over the CMP stop layer 130, filling spaces between the sacrificial gates 118. The dielectric fill layer 132 may include one or more layers of silicon dioxide, BPSG and/or low-k dielectric material. The dielectric fill layer 132 may be formed by a PECVD process, by a high density plasma (HDP) process, or by a high aspect ratio process (HARP) using ozone and tetraethyl orthosilicate, also known as tetraethoxysilane (TEOS).

Referring to FIG. 1H, an oxide CMP process 134, depicted schematically in FIG. 1H as the Oxide CMP pad, is used to remove dielectric material from the dielectric fill layer 132, planarizing a top surface of the dielectric fill layer 132 and exposing the CMP stop layer 130 over the sacrificial gates 118. The CMP process 134 may possibly expose the gate caps 116. The CMP process 134 is ceased before the sacrificial gates 118 are exposed, advantageously providing a flat topography without causing undesired variation in heights of the sacrificial gates 118.

Referring to FIG. 1I, a selective plasma etch process 136 removes the CMP stop layer 130 and the gate caps 116 of FIG. 1H so as to expose the sacrificial gates 118. The selective plasma etch process 136 removes material from the CMP stop layer 130 at least twice as quickly as it removes material from the dielectric fill layer 132, advantageously leaving the dielectric fill layer 132 extending above the sacrificial gates 118 so as to prevent metal shorts between adjacent instances of the replacement metal gates. The offset spacers 120 may be eroded by the selective plasma etch process 136, as depicted in FIG. 1I.

Referring to FIG. 1J, an optional second oxide CMP process 134, depicted schematically in FIG. 1J as the Oxide CMP pad, may be performed to lower a top surface of the dielectric fill layer 132 closer to the sacrificial gates 118, which may advantageously provide additional process margin during a subsequent metal CMP process for forming the replacement metal gates. The second oxide SMP process 134 is ceased before removing a significant amount of material, possibly any material, from the sacrificial gates 118.

Referring to FIG. 1K, the sacrificial gates 118 of FIG. 1I are removed without significantly degrading the substrate 102 to form gate cavities 138. In one version of the instant example, the offset spacers 120 and the gate dielectric layer 104 of FIG. 1I may be removed with the sacrificial gates 118, as depicted in FIG. 1K. Polysilicon in the sacrificial gates 118 may be removed using an aqueous solution of ammonium hydroxide or tetramethyl ammonium hydroxide. The offset spacers 120 and the gate dielectric layer 104 may be subsequently removed using a dilute buffered aqueous solution of hydrofluoric acid. The sidewall spacers 122 and the CMP stop layer 130 may be substantially left intact while the sacrificial gates 118 are removed. The dielectric fill layer 132 may also be substantially left intact while the sacrificial gates 118 are removed.

Referring to FIG. 1L, a high-k gate dielectric layer 140 is formed over an existing top surface of the integrated circuit 100, extending into the gate cavities 138 and forming a continuous layer over the substrate 102 in the gate cavities 138. The high-k gate dielectric layer 140 may be 1 nanometer to 3 nanometers thick, and may include any combination of silicon dioxide, silicon oxy-nitride, aluminum oxide, aluminum oxy-nitride, hafnium oxide, hafnium silicate, hafnium silicon oxy-nitride, zirconium oxide, zirconium silicate, and zirconium silicon oxy-nitride. The high-k gate dielectric layer 140 may be formed by a metal-organic chemical vapor deposition (MOCVD) process or an atomic layer deposition (ALD) process.

A layer of work function metal 142 is formed over the high-k gate dielectric layer 140, extending into the gate cavities 138. The layer of work function metal 142 may include 3 nanometers to 10 nanometers of titanium nitride, titanium aluminum nitride, titanium, or other metals to provide a desired work function. The layer of work function metal 142 may be formed by MOCVD, ALD or sputter processes. An optional layer of barrier metal, not shown, may possibly be formed over the layer of work function metal 142 to reduce diffusion of metals between the layer of work function metal 142 and a subsequently formed gate fill metal.

A layer of gate fill metal 144 is formed over the layer of work function metal 142, and over the barrier metal if present, extending into the gate cavities 138. The layer of gate fill metal 144 may include aluminum, or cobalt aluminum alloy. The layer of gate fill metal 144 may be formed by MOCVD or sputter processes.

Referring to FIG. 1M, the layer of gate fill metal 144, the layer of work function metal 142 and the high-k gate dielectric layer 140 are removed from over a top surface of the dielectric fill layer 132, to form the replacement metal gates 146. The layer of gate fill metal 144, the layer of work function metal 142 and the high-k gate dielectric layer 140 may be removed by a metal CMP process 148, depicted schematically in FIG. 1M by the Metal CMP pad. Removal of the layer of gate fill metal 144, the layer of work function metal 142 and the high-k gate dielectric layer 140 may be ceased so as to form a wide top section 150 of the replacement metal gates 146 which is wider than the replacement metal gates 146 immediately over the substrate 102. Forming the wide top section 150 may advantageously reduce an electrical resistance of the replacement metal gates 146. Fabrication of the integrated circuit 100 may be continued by forming dielectric layers, contacts and metal interconnects over the replacement metal gates 146.

Referring to FIG. 1N, in an alternate version of the instant example, the metal CMP process 148 may be continued so as to remove the wide top section 150 of the replacement metal gates 146 of FIG. 1M. Removal of the wide top section 150 may advantageously provide additional process margin for aligning contacts to the replacement metal gates 146 without forming shorts to adjacent replacement metal gates 146. Fabrication of the integrated circuit 100 may be continued by forming dielectric layers, contacts and metal interconnects over the replacement metal gates 146.

Figure 2A:
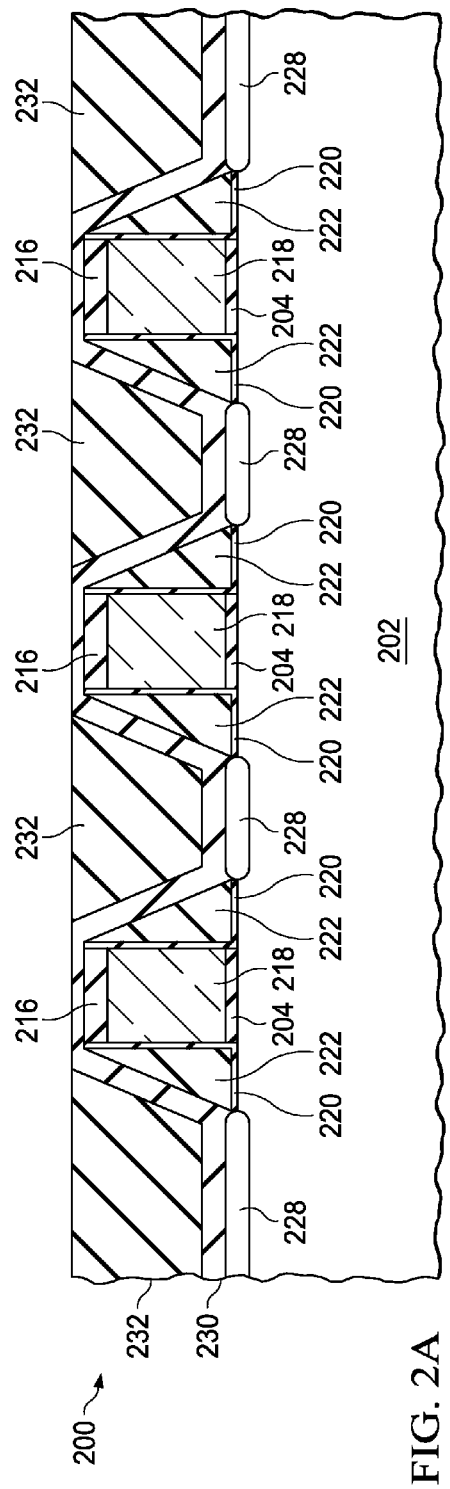
FIG. 2A through FIG. 2E are cross sections of an integrated circuit containing metal replacement gates formed according to another example method, depicted in successive stages of fabrication.

FIG. 2A through FIG. 2E are cross sections of an integrated circuit containing metal replacement gates formed according to another example method, depicted in successive stages of fabrication. Referring to FIG. 2A, the integrated circuit 200 is formed on a substrate 202 which includes semiconductor material. A gate dielectric layer 204, sacrificial gates 218, optional gate caps 216, offset spacers 220 and sidewall spacers 222 are formed over a top surface of the substrate 202 as described in reference to FIG. 1A through FIG. 1C. A layer of metal silicide 228 is formed at the top surface of the substrate 202 between the sidewall spacers 222 as described in reference to FIG. 1D through FIG. 1F. A CMP stop layer 230 and a dielectric fill layer 232 are formed over the sacrificial gates 218 and the substrate 202 as described in reference to FIG. 1G. The dielectric fill layer 232 is planarized so as to expose the CMP stop layer 230 as described in reference to FIG. 1H.

Figure 2B:
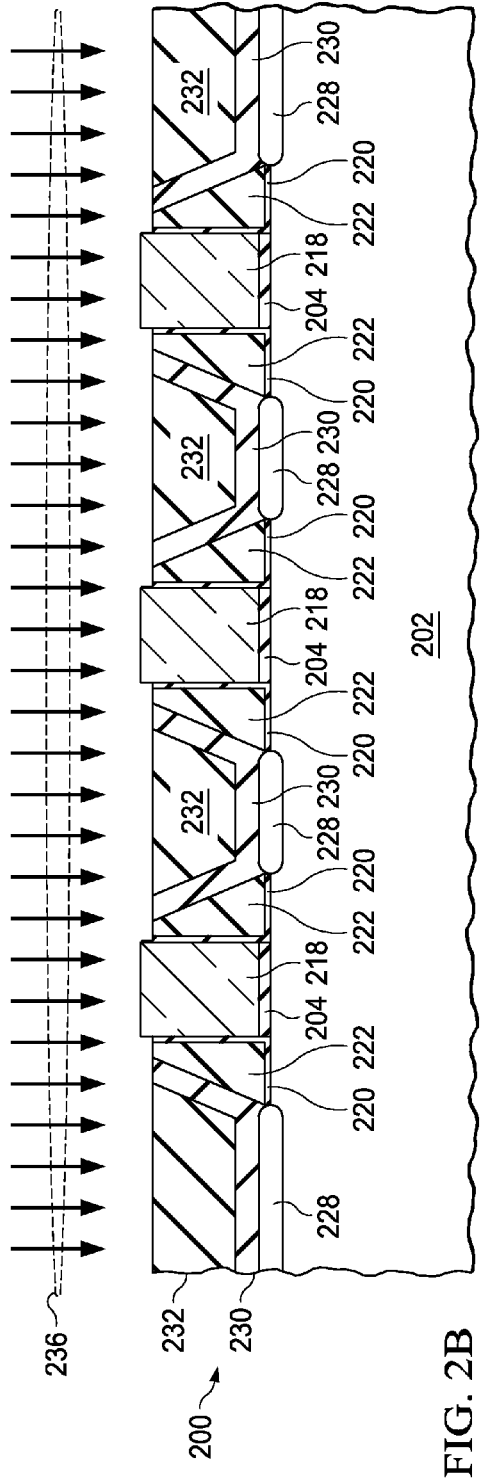

Referring to FIG. 2B, a non-selective plasma etch process 236 removes the CMP stop layer 230, the dielectric fill layer 232, the gate caps 216 of FIG. 2A, the offset spacers 220 and the sidewall spacers 222 so as to expose the sacrificial gates 218. The non-selective plasma etch process 236 may have an etch rate of the CMP stop layer 230 which is 75 percent to 150 percent of an etch rate of the dielectric fill layer 232, so that a top surface of the CMP stop layer 230 and dielectric fill layer 232 remains substantially planar, which may advantageously provide desired process margin during a subsequent metal CMP process to form the replacement metal gates.

Figure 2C:
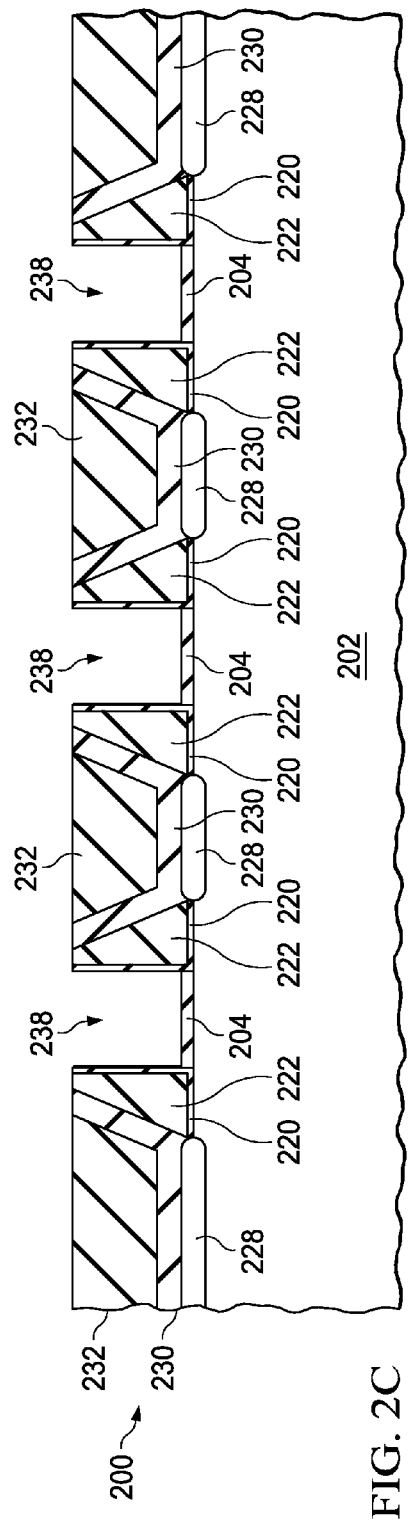

Referring to FIG. 2C, the sacrificial gates 218 of FIG. 2B are removed without significantly degrading the gate dielectric layer 204 to form gate cavities 238. In one version of the instant example, the sacrificial gates 218 may be removed while leaving the gate dielectric layer 204 and the offset spacers 220 substantially intact, as depicted in FIG. 2C. The sacrificial gates 218 may be removed by an aqueous solution of ammonium hydroxide or tetramethyl ammonium hydroxide. The gate dielectric layer 204 and the offset spacers 220 may be left in place during subsequent formation of the replacement metal gates. Alternatively, the gate dielectric layer 204 and the offset spacers 220 may be removed as described in reference to FIG. 1K.

Figure 2D:
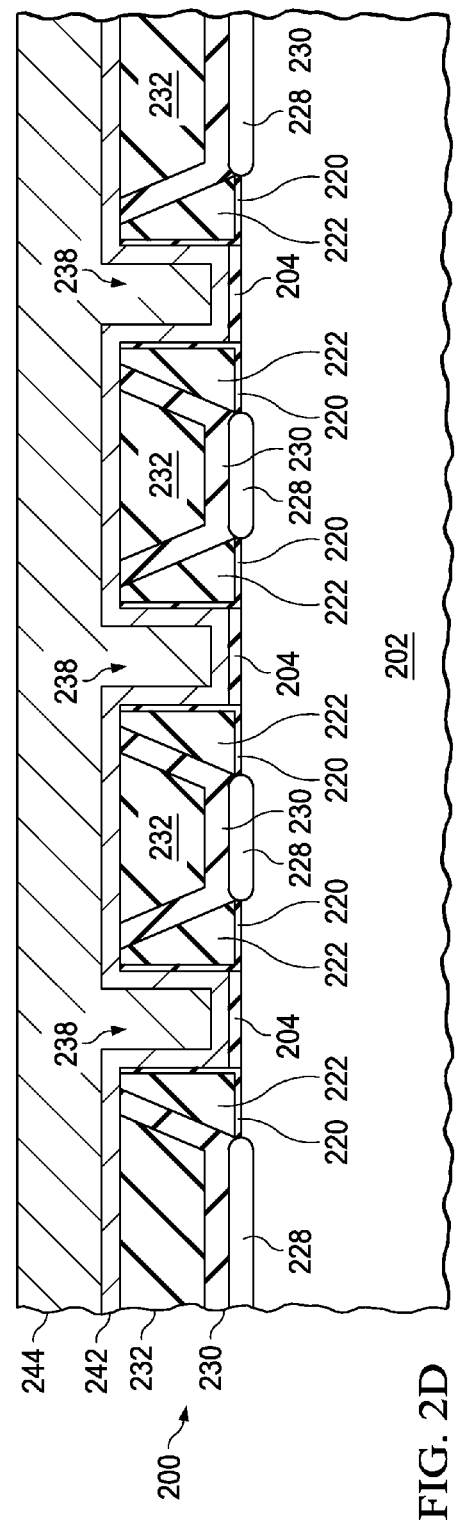

Referring to FIG. 2D, a layer of work function metal 242 is formed over an existing top surface of the integrated circuit 200, extending into the gate cavities 238 and forming a continuous layer over the gate dielectric layer 204 in the gate cavities 238. The layer of work function metal 242 may have the composition and thickness disclosed in reference to FIG. 1L. An optional layer of barrier metal, not shown, may possibly be formed over the layer of work function metal 242. A layer of gate fill metal 244 is formed over the layer of work function metal 242, and over the barrier metal if present, extending into the gate cavities 238.

Figure 2E:
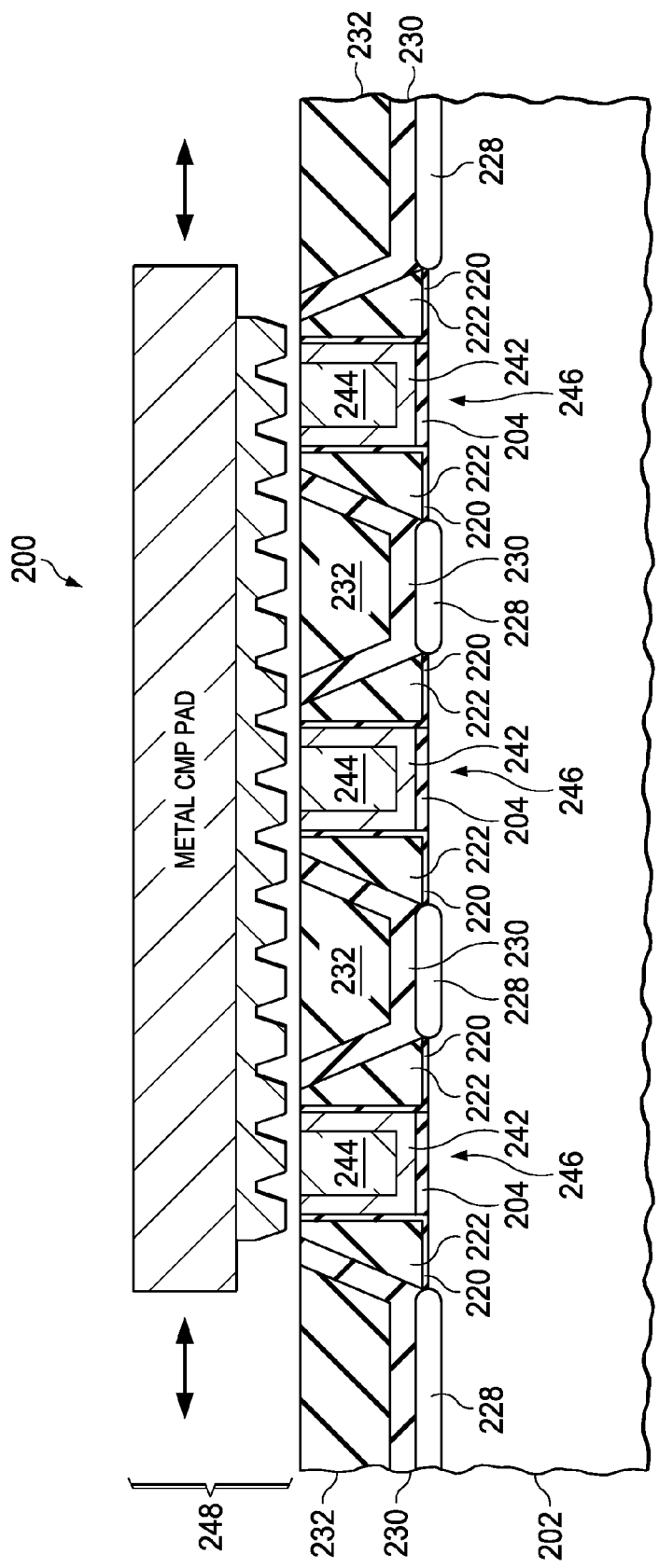

Referring to FIG. 2E, the layer of gate fill metal 244 and the layer of work function metal 242 are removed from over a top surface of the dielectric fill layer 232, to form the replacement metal gates 246. The layer of gate fill metal 244 and the high-k gate dielectric layer 240 may be removed by a metal CMP process 248, depicted schematically in FIG. 2E as the Metal CMP pad. Forming the integrated circuit 200 according to the instant example may advantageously reduce fabrication cost and complexity compared to other fabrication sequences. Fabrication of the integrated circuit 200 may be continued by forming dielectric layers, contacts and metal interconnects over the replacement metal gates 246.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of forming an integrated circuit, comprising the steps:
   providing a substrate comprising semiconductor material;
   forming a gate dielectric layer over said substrate;
   forming sacrificial gates over said gate dielectric layer;
   forming a chemical mechanical polish (CMP) stop layer over said sacrificial gates;
   forming a dielectric fill layer over said CMP stop layer, said dielectric fill layer filling spaces between said sacrificial gates;
   performing a first oxide CMP process which removes dielectric material from said dielectric fill layer, planarizes a top surface of said dielectric fill layer and exposes said CMP stop layer over said sacrificial gates without removing material from said sacrificial gates;
   performing a selective plasma etch process which removes said CMP stop layer and so as to expose said sacrificial gates, wherein said selective plasma etch process removes material from said CMP stop layer at least twice as quickly as material from said dielectric fill layer;
   removing said sacrificial gates to form gate cavities;
   performing a second oxide CMP process which lowers a top surface of said dielectric fill layer without removing material from said sacrificial gates, after said step of performing said selective plasma etch process which removes said CMP stop layer and prior to said step of removing said sacrificial gates; and
   forming replacement metal gates in said gate cavities.

2. The method of claim 1, further comprising the steps:
   forming offset spacers of dielectric on lateral surfaces of said sacrificial gates; and
   forming sidewall spacers on said offset spacers, prior to said step of forming said CMP stop layer.

3. The method of claim 1, wherein said CMP stop layer includes silicon nitride.

4. The method of claim 1, further comprising the steps:
   forming gate caps of dielectric material over said sacrificial gates prior to said step of forming said CMP stop layer;
   forming a layer of metal silicide at a top surface of said substrate, wherein said gate caps block formation of said metal silicide on said sacrificial gates; and
   removing said gate caps after said step of performing said selective plasma etch process which removes said CMP stop layer and prior to said step of removing said sacrificial gates.

5. The method of claim 4, wherein said gate caps include silicon nitride.

6. The method of claim 4, wherein said gate caps include silicon oxynitride.

7. The method of claim 1, wherein said step of forming said replacement metal gates comprises the steps:
   forming a layer of work function metal over said dielectric fill layer, extending into said gate cavities;
   forming a layer of gate fill metal over said layer of work function metal, extending into said gate cavities; and
   removing said layer of gate fill metal and said layer of work function metal from over a top surface of said dielectric fill layer using a metal CMP process.

8. The method of claim 7, wherein said step of removing said layer of gate fill metal and said layer of work function metal is ceased so as to form a wide top section of said replacement metal gates.

9. The method of claim 1, further comprising the steps:
   removing said gate dielectric layer after said step of removing said sacrificial gates; and
   forming a high-k gate dielectric layer over said substrate in said gate cavities prior to said step of forming said replacement metal gates.

10. A method of forming an integrated circuit, comprising the steps:
    providing a substrate comprising semiconductor material;
    forming a gate dielectric layer over said substrate;
    forming sacrificial gates having gate caps over said gate dielectric layer, said gate caps being disposed over said sacrificial gates;
    forming offset spacers of dielectric on lateral surfaces of said sacrificial gates;
    forming sidewall spacers on said offset spacers;
    forming a layer of metal silicide at a top surface of said substrate, wherein said gate caps block formation of said metal silicide on said sacrificial gates;
    forming a CMP stop layer over said sacrificial gates, said gate caps and said sidewall spacers;
    forming a dielectric fill layer over said CMP stop layer, said dielectric fill layer filling spaces between said sidewall spacers;
    performing a first oxide CMP process which removes dielectric material from said dielectric fill layer, planarizes a top surface of said dielectric fill layer and exposes said CMP stop layer over said sacrificial gates without removing material from said sacrificial gates;
    performing a selective plasma etch process which removes said CMP stop layer and so as to expose said sacrificial gates, wherein said selective plasma etch process removes material from said CMP stop layer at least twice as quickly as material from said dielectric fill layer;
    performing a second oxide CMP process which lowers a top surface of said dielectric fill layer without removing material from said sacrificial gates;
    removing said sacrificial gates to form gate cavities;
    removing said gate dielectric layer;
    forming a high-k gate dielectric layer over said substrate in said gate cavities; and
    forming replacement metal gates over said high-k gate dielectric layer in said gate cavities.

11. The method of claim 10, wherein said CMP stop layer includes silicon nitride.

* * * * *